United States Patent [19]
Allen et al.

[11] Patent Number: 5,361,038
[45] Date of Patent: Nov. 1, 1994

[54] ACTIVE LOAD APPLICATIONS FOR DISTRIBUTED CIRCUITS

[75] Inventors: Barry R. Allen, Redondo Beach; Rahul Dixit, Cerritos; Bradford L. Nelson, Hermosa Beach; Juan C. Carillo, Gardena; William L. Jones, Inglewood, all of Calif.

[73] Assignee: TRW Inc., Redondo Beach, Calif.

[21] Appl. No.: 31,256

[22] Filed: Mar. 11, 1993

[51] Int. Cl.⁵ .......................... H03F 3/60; H03F 3/68
[52] U.S. Cl. ..................................... 330/54; 330/147; 330/148; 330/277; 330/286; 330/295
[58] Field of Search ...................... 330/54, 124 R, 147, 330/148, 277, 286, 295, 301

[56] References Cited

U.S. PATENT DOCUMENTS

| | | | |
|---|---|---|---|
| 4,668,920 | 5/1987 | Jones | 330/54 X |
| 4,769,618 | 9/1988 | Parish et al. | |
| 5,012,203 | 4/1991 | Beyer et al. | |

FOREIGN PATENT DOCUMENTS 4123437 1/1993 Germany .............................. 330/54

OTHER PUBLICATIONS

"An Active 'Cold' Noise Source", IEEE Transactions on Microwave Theory and Techniques, vol. MTT-29, No. 4, Apr. 1981, pp. 344-347 R. Frater and D. Williams.

C. Aitchison, "The Intrinsic Noise Figure of the MESFET Distribute Amplifier", IEEE Transactions on Microwave Theory and Techniques, vol. MTT-33, No. 6, Jun. 1985, pp. 460-466.

*Primary Examiner*—James B. Mullins

[57] ABSTRACT

An active load applied to the gate transmission line termination of distributed power devices reduces the low frequency noise power appearing at the output of the device. The active load, including at least one active device such as a field effect transistor, operates by transforming the input impedance of a low noise amplifier to the desired load impedance. The active load is connected to one end of an input transmission line having a plurality of impedances connected in electrical series. An input terminal is connected to the opposite end. An output transmission line, also having a plurality of impedances connected in series, has an output terminal at one end and a terminating output impedance at the other. A plurality of active devices are connected to junction points between the series connected impedances of the input and output lines.

15 Claims, 2 Drawing Sheets

ACTIVE LOAD APPLICATIONS FOR DISTRIBUTED CIRCUITS

BACKGROUND OF THE INVENTION

1. Technical Field

This invention relates generally to distributed circuits and, more particularly, to an active load architecture for distributed circuit gate transmission line termination.

2. Discussion

Distributed circuits such as distributed amplifiers, distributed power dividers, and distributed power combiners are commonly employed in various applications, especially broad band communication and radar systems operating at microwave frequencies. Distributed circuits used in these applications often consist of a number of amplifying sections, typically periodically spaced active devices, which are coupled between electrically short, high impedance input and output transmission lines. Impedances in the input and output transmission lines function in combination with internal capacitances of the active devices to produce a desired characteristic transmission line impedance.

This circuit architecture requires a broadband radio frequency (RF) termination on the distributed input and output transmission lines in order to effect matching and thereby prevent reflection of an applied pulse. Transmission line matching is achieved by connecting the transmission line to ground through a terminating impedance substantially equal to the line's characteristic impedance. distributed transmission line termination is made with passive resistive and/or reactive elements. Although low reflection terminations can be realized using these elements, they typically generate substantial thermal noise power which appears on the output of the device to degrade the noise figure of the device. The adverse effect of this termination thermal noise power further increases at low frequencies due to incomplete cancellation of the reverse traveling wave in the output circuit.

It would therefore be desirable to provide a distributed gate transmission line termination for these devices which is both low in reflection and in noise power.

SUMMARY OF THE INVENTION

By employing an active load as a distributed input transmission line termination, the low frequency noise power generated in the termination is minimized while a low reflection coefficient is maintained. The active load includes at least one active device and is connected to one end of an input transmission line having a plurality of impedances connected in electrical series. An input terminal is connected to the opposite end. An output transmission line, also having a plurality of impedances connected in series, has an output terminal at one end and a terminating output impedance at the other. A plurality of active devices are connected to junction points between the series connected impedances of the input and output lines.

The active load creates an effective load resistor having thermal output noise lower than room temperature and, therefore, having a lower available noise power than an equivalent conventional resistor at the same physical temperature.

Additional advantages and features of the present invention will become apparent from the following description and amended claims, taken in conjunction with the accompanying drawings.

DETAILED DESCRIPTION OF THE PREFERRED EMBODIMENTS

Figure 1:
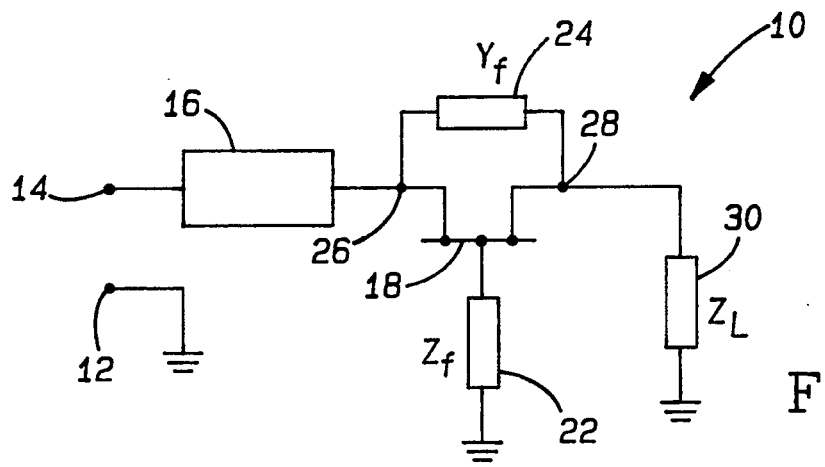
FIG. 1 is a schematic diagram of an exemplary active load configuration according to the teachings of the present invention.

Referring now to FIG. 1, a first preferred embodiment of an active load distributed circuit transmission line termination according to the teachings of the present invention is shown generally at 10. Active load configuration 10 includes a first input node 12 which is grounded and a second input node 14 which is electrically connected to a matching network 16. Matching network 16 preferably includes passive circuit elements which serve to effectively transform the device input impedance at a node 26 to a resistance.

Active load configuration 10 further includes an active device, preferably a field-effect transistor (FET) 18, having its gate terminal connected to a first impedance 22, typically a capacitor and resistor network. An admittance 24, such as a series resistor and capacitor network or open circuit, is connected at junctions 26 and 28 to the source and drain terminals, respectively, of FET 18. Also connected to the drain terminal of FET 18, at junction 28, is a second impedance 30 which is grounded.

Figure 2:
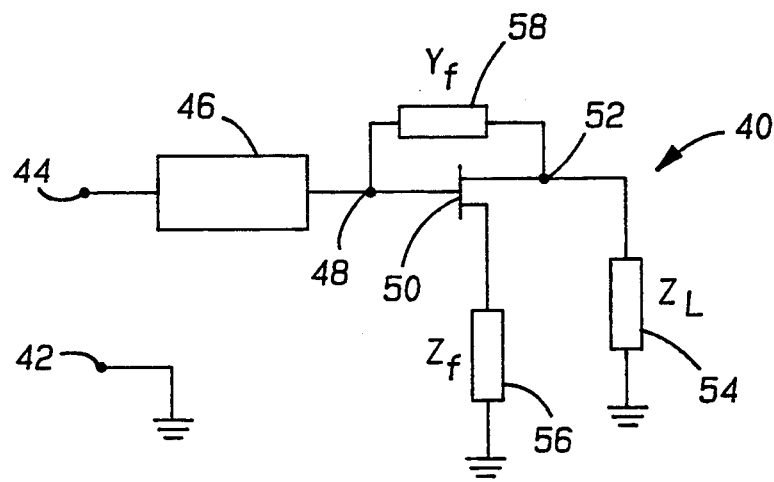
FIG. 2 is a schematic diagram of an alternate preferred embodiment of an active load configuration according to the teachings of the present invention.

An alternately configured embodiment of an active load transmission line termination according to the teachings of the present invention is illustrated schematically in FIG. 2 and is indicated generally at 40. This illustrative embodiment includes a grounded input node 42 as well as a second input node 44 connected to a matching network 46, designed to transform the device input impedance to a resistance in the band of interest. Matching network 46 is preferably similar to matching network 16 in the first embodiment described above and is connected at junction 48 to the gate terminal of the active load active device, such as FET 50. The source terminal of FET 50 is connected at junction 52 to a first impedance 54, such as an inductor, and the drain terminal of FET 50 is connected to a second impedance 56, first and second impedances 54 and 56 being grounded.

At junctions 48 and 52, connected across the gate and source terminals of FET 50, respectively, is an admittance 58, preferably a series resistor, capacitor and inductor network. The input impedance of the FET 50 employed in this second embodiment is preferably configured so as to be primarily capacitive with only a very small series resistance. The inductance added to the source circuit is transformed to appear as a noiseless resistor in the gate circuit.

The broad band low noise active load of the present invention therefore generally includes a low noise amplifying device combined with various other resistive and reactive elements. The active load operates by transforming the input impedance of a low noise amplifier to the desired load impedance. The active load input matching network and an output termination in the distributed circuit in which the active load is applied are preferably adjusted so as to provide low available noise power in a desired resistive load impedance.

Figure 3:
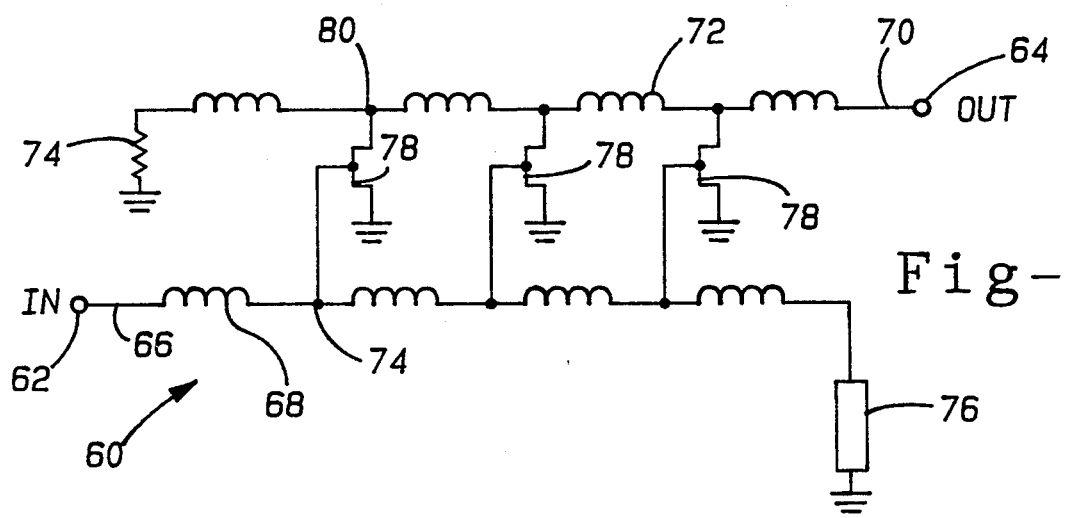
FIG. 3 is a schematic diagram of an active load transmission line termination embodied in a distributed amplifier application.

The application of an active load transmission line termination as described above to a distributed amplifier circuit is shown generally at 60 in FIG. 3. As shown in FIG. 3, amplifier 60 has an input port 62, an output port 64, an input line 66, preferably consisting of a series of high impedance microstrip transmission lines 68, an output line 70, also preferably consisting of a series of high impedance microstrip lines 72, a matching impedance 74 connected to ground, an active load 76 connected to ground applied as a gate transmission line termination, and a series of active devices, preferably FETs 78, connected in a common source configuration.

The drain terminal or output terminal of each FET 78 is connected to a junction node 80 between microstrip segments 68 of the output line 70. The gate terminal or input terminal is connected to a junction node 74 between input line microstrip segments 68. The active load 76 applied as the gate transmission line termination of the distributed amplifier 60 may be configured as either of the two embodiments discussed above or in any other manner consistent with the teachings herein.

Noise generated in the active load 76 is amplified by active devices 78. At frequencies above approximately one third of the amplification cutoff frequency, the noise from the active load 76 is predominantly dissipated in the output termination 74 and does not significantly add to the output noise at output terminal 64. However, at lower frequencies, the noise power from the input termination 76 increases the noise at the amplifier output 76 and degrades the amplifier noise figure. But the active load 76, having an available noise power that is less than a resistor at the same physical temperature, thus reduces the overall noise in the distributed amplifier 60. Since input termination noise appears at the output only at low frequencies, the input termination of the distributed circuits as described herein could alternately be implemented by a diplexing network with the active load effective at low frequencies and a passive resistive load effective at high frequencies.

Figure 4:
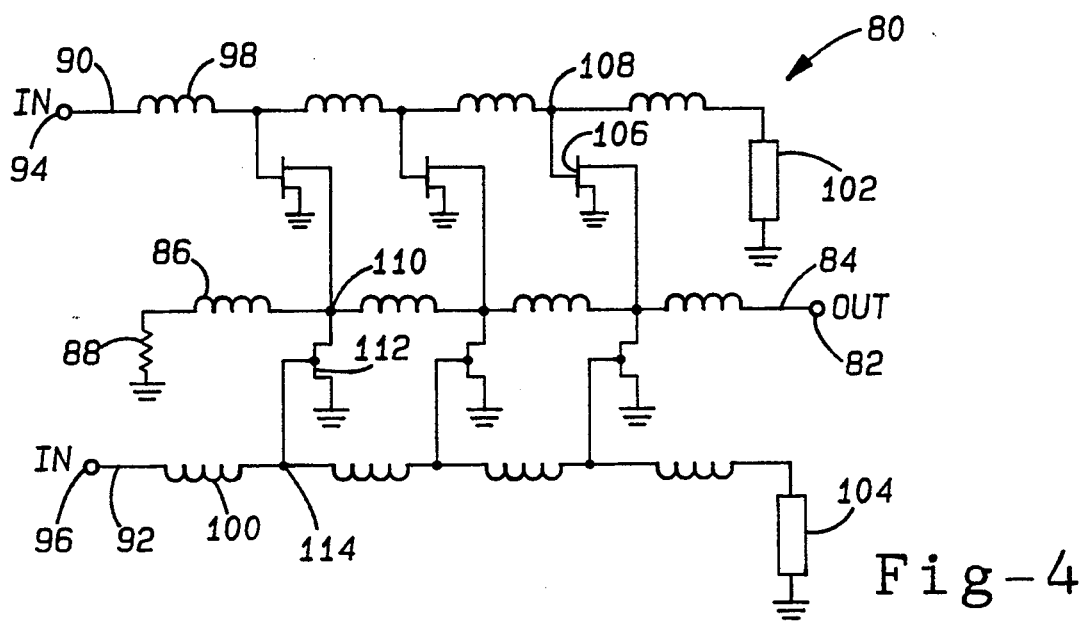
FIG. 4 is a schematic diagram of an active load transmission line termination embodied in a distributed power combiner application.

The application of an active load of the present invention to a distributed power combiner is shown schematically in FIG. 4, generally at 80. A power combiner, used to combine two or more inputs into a single output, is configured generally similar to the distributed amplifier discussed above but has at least one additional input line. Power combiner 80 includes an output port 82 connected to an output line 84 having a plurality of series connected impedances 86 and a terminating impedance 88 which is connected to ground. Active power combiner 80 also includes two input lines, 90 and 92, but may alternately have any number of additional input lines. Input lines 90 and 92 have input nodes 94 and 96 connected to a plurality of impedances 98 and 100 which are connected in electrical series and then connected to active loads 102 and 104 and to ground. Active loads 102 and 104 may each be of either of the configurations illustrated at 10 and 40 in FIGS. 1 and 2.

Connected between input line 90 and output line 84 are a plurality of active devices, preferably field-effect transistors (FETs) 106. Each of the gate, or input, terminals of FETs 106 is connected at a junction 108 between input line impedances 98. The drain, or output, terminals are connected at junctions 110 between output line impedances 86. Also connected to junctions 110 are the drain terminals of each of another plurality of active devices such as FETs 112 which are also connected in a common source configuration, having the gate terminals thereof connected at junctions 114 to input line 92 between impedances 100. Active loads 102 and 104 in this power combiner 80 function in the manner described above in conjunction with distributed amplifier 60.

Figure 5:
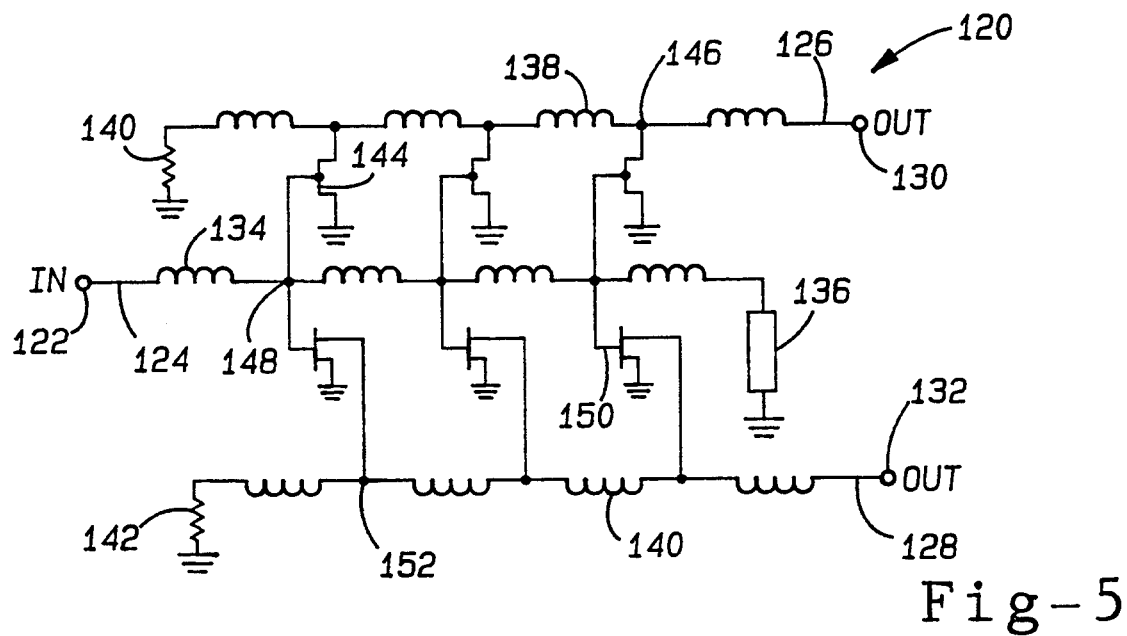
FIG. 5 is a schematic diagram of an active load transmission line termination embodied in a distributed power divider application.

A preferred embodiment of a distributed power divider incorporating an active load according to the teachings of the present invention is shown generally at 120 in FIG. 5. The divider generally divides a single input into multiple outputs and, therefore, is generally the reverse of a combiner wherein the FET input and output terminals are reversed.

Divider 120 includes a single input node 122 connected to input line 124 as well as two output lines 126 and 128 having output ports 130 and 132, respectively. Input line 124 includes a plurality of impedances 134 and terminates with an active load 136 which is grounded. Output line 126 includes a plurality of series connected impedances 138 and an output impedance 140 which is grounded. Similarly, output line 128 includes a plurality of impedances 140 in series and terminates in grounded output impedance 142.

Between input line 124 and output line 126 are connected a plurality of active devices, preferably field-effect transistors (FETs) 144, each having a grounded source terminal. The drain or output terminals of FETs 144 are connected to nodes 146 in output line 126 between impedances 138. Gate or input terminals of FETs 144 are connected at junctions 148 in input line 124 between impedances 134. Likewise, between input line 124 and output line 128 are connected a plurality of FETs 150, having gate terminals connected to junctions 148 as well as drain terminals connected to nodes 152 in output line 128 between impedances 140 and having source terminals which are grounded.

Figure 6:
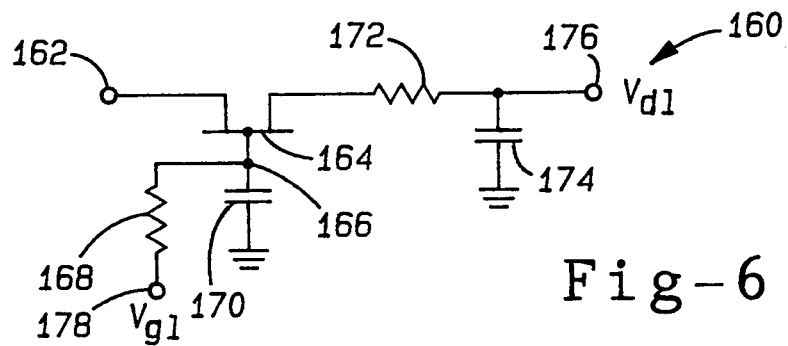
FIG. 6 is a detailed schematic diagram of a distributed circuit active load transmission line termination which has been implemented in hardware and tested.

An active load circuit which has been physically implemented into hardware and tested is shown at 160 in FIG. 6. Active load 160, configured generally in conformance with the teachings of the present invention embodied as shown in the schematic representations of FIGS. 1 and 2, includes an input node 162 connected to the source terminal of a field-effect transistor 164. The gate terminal is connected at junction 166 to both a resistor 168 and a capacitor 170 which is grounded. The drain terminal is connected through resistor 172 to capacitor 174 which is also grounded. A drain bias voltage 176 and a gate bias voltage 178 are connected to resistors 172 and 168, respectively. In a test situation, active load circuit 160 was shown to significantly reduce noise power in distributed circuits, especially at low frequencies.

The foregoing discussion discloses and describes merely exemplary embodiments of the present invention. One skilled in the art will readily recognize from such discussion, and from the accompanying claims, that various changes and modifications can be made therein without departing from the spirit and scope of the invention as defined in the following claims.

What is claimed is:

1. A distribute circuit comprising:
   an input transmission line having a plurality of impedances connected in electrical series, an input terminal at one end of said input transmission line and an active load connected between the opposite end of the transmission line and ground, said active load including at least one active device;
   an output transmission line having a plurality of impedances connected in electrical series, an output terminal at one end of said output transmission line and an output impedance connected between the opposite end of the output transmission line and ground;
   a plurality of active devices, each active device of said plurality having an input terminal being connected to junction points between said impedances of said input transmission line and an output terminal connected to junction points between said impedances of said output transmission lines; and
   wherein a gate terminal of said active load active device is connected to ground through a first impedance, a source terminal is connected to a matching network and to a admittance, and a drain terminal is connected to said admittance and through a second impedance to ground, said admittance being connected across said source and drain terminals.

2. The circuit of claim 1 wherein said plurality of active devices comprise field-effect transistors, said transistors being connected to said input and output transmission lines in a common source configuration.

3. The circuit of claim 1 wherein said distributed circuit is a distributed amplifier.

4. The circuit of claim 1 wherein said distributed circuit is a distributed power combiner, said power combiner further comprising:
   a second input transmission line having a plurality of series connected impedances, a second input terminal at one end of said second input transmission line and a second active load at the opposite end, said second active load including at least one active device; and
   a second plurality of active devices, each active device of said second plurality having an input terminal connected to junction points between impedances of said second input transmission line and an output terminal connected to junction points between impedance of said output transmission line.

5. The circuit of claim 4 wherein said second active load active device comprises a field-effect transistor having a gate terminal, a drain terminal and a source terminal.

6. The circuit of claim 5 wherein said gate terminal of said second active load active device is connected through a first impedance to ground, said source terminal is connected to a matching network and to an admittance and said drain terminal is connected to said admittance and through a second impedance to ground, said admittance being connected across said source and drain terminals.

7. The circuit of claim 5 wherein said gate terminal of said second active load active device is connected to a matching network and to an admittance, said source terminal is connected through a first impedance to ground and to said admittance and said drain terminal is connected through a second impedance to ground, said admittance being connected across said gate and source terminals.

8. The circuit of claim 5 wherein said source terminal of said second active load device is connected to said second input transmission line, said gate terminal is connected through a first capacitor to ground and through a first resistor to a gate bias voltage and said drain terminal is connected through a second resistor and second capacitor to ground, said second resistor and second capacitor being connected in electrical series, said drain terminal is also being connected through said second resistor to a drain bias voltage.

9. The device of claim 1 wherein said distributed circuit is a distributed power divider, further comprising:
   a second output transmission line having a plurality of impedances connected in electrical series, an output terminal at one end of said second output transmission line and an output impedance connected between the opposite end and ground; and
   a second plurality of active devices, each having an input terminal being connected to junction points between impedances of said input transmission line and an output terminal connected to junction points between impedances of said second output transmission line.

10. A distributed circuit comprising:
    an input transmission line having a plurality of impedances connected in electrical series, an input terminal at one end of said input transmission line and an active load connected between the opposite end of the input transmission line and ground, said active load including at least one active device;
    an output transmission line having a plurality of impedance connected in electrical series, an output terminal at one end of sad output transmission line and an output impedance connected between the opposite end of the output transmission line and ground;
    a plurality of active devices, each active device of said plurality having an input terminal being connected to junction points between said impedances of said input transmission line and an output terminal connected to junction points between said impedances of said output transmission line; and
    wherein a gate terminal of said active load active device is connected to a matching network and to an admittance, a source terminal is connected through a first impedance to ground and to said admittance and a drain terminal is connected through a second impedance to ground, said admittance being connected across said gate and source terminals.

11. The device of claim 10, wherein said distributed circuit is a distributed power divider, further comprising:
    a second output transmission line having a plurality of impedances connected in electrical series, an output terminal at one end of said second output transmission line and an output impedance connected between the opposite end and ground; and
    a second plurality of active devices, each having an input terminal being connected to junction points between impedances of said input transmission line and output terminal connected to junction points between impedance of said second output transmission line.

12. A distributed power combiner comprising:

first and second input transmission lines each having a plurality of impedances connected in electrical series, an input terminal at one end of said input transmission lines and an active load connected between an opposite end and to said admittance and through a second impedance to ground, said a ground, said active load including a field-effect transistor;

an output transmission line having a plurality of impedances connected in electrical series, said output transmission line having an output terminal at one end and the opposite end being connected through an output terminal to ground;

a plurality of field-effect transistors, each transistor having an input terminal connected to junction points between impedances of one of said first and second input transmission lines and an output terminal connected to junction points between impedances of said output transmission line; and wherein a gate terminal of said active load active device is connected to ground through a first impedance, a source terminal is connected to a matching network and to an admittance, and a drain terminal is connected to said admittance and through a second impedance to ground, said admittance being connected across said source and drain terminals.

13. A distributed power divider comprising:

an input transmission line having a plurality of impedances connected in electrical series, an input terminal at one end of said input transmission line and an active load connected between an opposite end and ground, said active load including a field-effect transistor;

first and second output transmission lines, each having a plurality of impedances connected in electrical series, an output terminal at one end and an opposite end connected through an output impedance to ground;

a plurality of field-effect transistors each having an input terminal connected to junction points between said input transmission line impedances and an output terminal connected to junction points between impedances of one of said first and second output transmission lines; and wherein a gate terminal of said active load active device is connected to ground through a first impedance, a source terminal is connected to a matching network and to an admittance, and a drain terminal is connected to said admittance and through a second impedance to ground, said admittance being connected across said source and drain terminals.

14. The distributed power divider of claim 13 wherein said active load further comprises a matching network.

15. The distributed power divider of claim 14 wherein said active load further comprises an active load impedance and an admittance.

* * * * *